(12) United States Patent
Yoda et al.

(10) Patent No.: US 7,009,873 B2
(45) Date of Patent: Mar. 7, 2006

(54) MAGNETIC RANDOM ACCESS MEMORY

(75) Inventors: Hiroaki Yoda, Kawasaki (JP); Tatsuya Kishi, Yokohama (JP); Junichi Miyamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 147 days.

(21) Appl. No.: 10/796,063

(22) Filed: Mar. 10, 2004

(65) Prior Publication Data

US 2005/0117391 A1    Jun. 2, 2005

(30) Foreign Application Priority Data

Mar. 11, 2003  (JP) ............................... 2003-065063
Mar. 8, 2004   (JP) ............................... 2004-063665

(51) Int. Cl.
    *G11C 11/00*    (2006.01)
(52) U.S. Cl. ..................................... 365/158; 365/182
(58) Field of Classification Search ................ 365/158, 365/182
    See application file for complete search history.

(56) References Cited

U.S. PATENT DOCUMENTS

| 6,269,018 | B1 * | 7/2001 | Monsma et al. | ............ 365/145 |
| 6,816,402 | B1 * | 11/2004 | Deak | .......................... 365/158 |
| 6,909,631 | B1 * | 6/2005 | Durlam et al. | .............. 365/158 |
| 6,950,333 | B1 * | 9/2005 | Hiramoto et al. | ........... 365/158 |

FOREIGN PATENT DOCUMENTS

JP            2002-170937           6/2002

* cited by examiner

Primary Examiner—Tuan T. Nguyen
(74) Attorney, Agent, or Firm—Oblon, Spivak, McClelland, Maier & Neustadt, P,C,

(57)    ABSTRACT

A magnetic random access memory in which "0" data and "1" data are associated with resistance values of a non-magnetic layer of a magnetoresistive element, the resistance values being variable depending on orientation of magnetization of a magnetic free layer and a magnetic pinned layer which sandwich the non-magnetic layer, and current is let to flow to first and second write current paths, which are provided close to the magnetoresistive element and are separated from each other, thereby producing a composite write magnetic field, changing a direction of magnetization of the free layer, wherein the first write current path includes a channel region of an insulated-gate transistor that is disposed close to the free layer, and the transistor is controlled such that a channel current with a desired magnitude flows in the transistor.

20 Claims, 8 Drawing Sheets

MAGNETIC RANDOM ACCESS MEMORY

CROSS-REFERENCE TO RELATED APPLICATIONS

This application is based upon and claims the benefit of priority from prior Japanese Patent Applications No. 2003-065063, filed Mar. 11, 2003; and No. 2004-63665, filed Mar. 8, 2004, the entire contents of both of which are incorporated herein by reference.

BACKGROUND OF THE INVENTION

1. Field of the Invention

The present invention relates generally to a magnetic random access memory (MRAM), and more particularly to a memory cell architecture in an MRAM that includes magnetic memory cells, each of which is formed using an element that stores "0"/"1" data by tunneling magnetoresistive effect.

2. Description of the Related Art

In recent years, a variety of memories, which store data based on novel principles, have been proposed. Of these, there is known an MRAM with nonvolatility and high operation speed, wherein magnetic memory cells, each of which is formed using a magnetic tunnel junction (MTJ) element that stores "0"/"1" data by tunneling magnetoresistive (TMR) effect, are arranged in a matrix.

FIG. 14 schematically shows a cross-sectional structure of an MTJ element 70 that is used in a conventional MRAM.

FIGS. 15A and 15B illustrate two states of the directions of spin in two magnetic layers 71 and 72 of the MTJ element 70 shown in FIG. 14.

The MTJ element 70 is configured such that one non-magnetic layer (tunneling barrier film) 73 is interposed between two magnetic layers 71 and 72. The MTJ element 70 stores "0"/"1" data, depending on whether the directions of spin of the two magnetic layers 71 and 72 are parallel, as shown in FIG. 15A, or antiparallel, as shown in FIG. 15B.

Normally, an antiferromagnetic layer 74 is disposed on one of the two magnetic layers 71 and 72. When the layer 74 is disposed on the layer 72, the antiferromagnetic layer 74 fixes the direction of spin of the magnetic layer 72. Thus, data can easily be rewritten by changing only the direction of spin of the other magnetic layer 71. The variable-spin side magnetic layer 71 is referred to as a "free layer", and the fixed-spin side magnetic layer 72 is as a "fixed layer" (or "pinned layer").

As is shown in FIG. 15A, when the directions of spin (indicated by arrows) in the two magnetic layers 71 and 72 are parallel (the same), the tunnel resistance of the tunneling barrier film 73 that is sandwiched between the two magnetic layers 71 and 72 decreases to a minimum (tunneling current increases to maximum).

As is shown in FIG. 15B, when the directions of spin in the two magnetic layers 71 and 72 are antiparallel, the tunnel resistance of the tunneling barrier film 73 that is sandwiched between the two magnetic layers 71 and 72 increases to a maximum (tunneling current decreases to minimum).

FIG. 16 schematically shows an example of a plan-view layout of a memory cell array of an MRAM that incorporates conventional memory cells. This example illustrates an architecture in a data write mode.

A plurality of write word lines WWL and a plurality of bit lines BL are arranged perpendicular to each other. At intersections of these lines, memory cells each comprising an MTJ element are disposed. Each MTJ element has rectangular shape with a longitudinal axis extending along the write word line WWL, and with a transverse axis extending along the bit line BL. The direction of spin, which is parallel to the longitudinal axis, is given to the MTJ element. In the MRAM, two states with different resistance values of the MTJ element are associated with a "1" data storage state ("1" state) and a "0" data storage data ("0" state), respectively.

FIG. 17 is a cross-sectional view, taken along line 15—15 in FIG. 16, showing an example of the structure of, in particular, one memory cell in a cross section perpendicular to the write word line WWL.

FIG. 18 is a cross-sectional view, taken along line 16—16 in FIG. 16, showing an example of the structure of the memory cell in a cross section perpendicular to the bit line BL.

In FIGS. 17 and 18, reference numeral 10 denotes a semiconductor substrate (e.g. P-type Si substrate); 11 a shallow-trench device isolation region (STI); 12 a gate oxide film; 13 an impurity diffusion layer ($N^+$) that functions as a drain region or a source region of a read-out cell select transistor Tr (NMOSFET); 14 a gate electrode (GC); 15 a first metal wiring layer (M1); 16 a second metal wiring layer (M2); 17 an MTJ connection wire formed of a third metal wiring layer (M3); 18 a conductive contact for electrically connecting the first metal wiring 15 to the diffusion layer 13; 19 a conductive contact for electrically connecting the second metal wiring layer 16 to the first metal wiring layer 15; 20 a conductive contact for electrically connecting the third metal wiring layer 17 to the second metal wiring layer 16; 70 an MTJ element; 22 a fourth wiring layer (M4); 23 a conductive contact for electrically connecting the fourth metal wiring layer 22 to the MTJ element 70; and 24 an interlayer insulation film.

In the Figures, the uses of the respective wiring layers are defined as follows: (BL) is a bit line for write/read, (WWL) is a write word line, (SL) is a source line, and (RWL) is a read-out word line. The source line (SL) is connected to a ground potential.

Now referring to FIG. 14 to FIG. 18, the operational principle of data write to the prior-art MTJ element 70 is described.

Data write to the MTJ is performed in the following manner. As is shown in FIG. 16, write currents in directions, for example, indicated by arrows, are let to flow in the write word line WWL and bit line BL. Using a composite field of magnetic fields Hy and Hx generated by these currents, the direction of spin of the free layer 71 can be set to be parallel or antiparallel, relative to the pinned layer 72. Thereby, data is written.

For example, when data is written to the MTJ element 70 shown in FIG. 16, a current in a first direction or in a second direction, which is opposite to the first direction, is supplied to the bit line BL in accordance with write data, thereby generating a magnetic field Hx. A current in a fixed direction is supplied to the write word line WWL, thereby generating a magnetic field Hy. Using a composite field produced by the magnetic fields Hx and Hy, data is written. In this case, if the current in the first direction is supplied to the bit line BL, the directions of spin in the MTJ element 70 become parallel. If the current in the second direction is supplied, the directions of spin become antiparallel. FIG. 16 illustrates the case where the direction of spin in the free layer 71 is made parallel to the direction of spin in the pinned layer 72 by the composite field.

When data is read out of the MTJ element 70, the read-out word line RWL shown in FIGS. 17 and 18 are activated to turn on the transistor Tr that is the switching device connected to the selected MTJ element 70. Thus, a current path is formed and a current is let to flow from the selected bit line BL to ground potential. As a result, a current corresponding to the resistance value of the selected MTJ element 70 flows only through the MTJ element 70. By detecting the current value, the data can be read out.

Referring to FIGS. 19 and 20, how the direction of spin in the MTJ element 70 is selected by the direction of applied field is described in brief.

FIG. 19 shows variation characteristics (MTJ curve) of resistance value due to reversal of applied field in the MTJ element 70.

FIG. 20 shows an asteroid curve of the MTJ element 70.

As indicated by the MTJ curve in FIG. 19, when a magnetic field Hx is applied in an easy-axis direction of the MTJ element, the resistance value (magnetoresistance (MR) ratio) of the MTJ element 70 changes by, e.g. about 17%. The ordinate in FIG. 17 expresses the resistance value of the MTJ element 70 as a change ratio (i.e. resistance ratio between pre-change and post-change). The MR ratio varies depending on the properties of the magnetic layers of the MTJ element 70. At present, an MTJ element with an MR ratio of about 50% is obtained. A composite field of an easy-axis field Hx and a hard-axis field Hy is applied to the MTJ element 70.

As shown by solid lines and broken lines in FIG. 19, the magnitude of the easy-axis field Hx, which is necessary for changing the resistance value of the MTJ element 70, varies depending on the magnitude of the hard-axis field Hy. The broken lines indicate MTJ curves in cases where the hard-axis field Hy is greater than in the case of the solid lines. Making use of this phenomenon, data can be written to only the MTJ element 70 in the arrayed memory cells, which is disposed at the intersection of the selected write word line WWL and selected bit line BL.

As is shown in FIG. 20, if the magnitude of the composite field of the easy-axis field Hx and hard-axis field Hy falls outside the asteroid curve (e.g. locations indicated by black circular marks), the direction of spin in the magnetic layer of the MTJ element 70 can be reversed.

On the other hand, if the magnitude of the composite field of the easy-axis field Hx and hard-axis field Hy falls inside the asteroid curve (e.g. locations indicated by white circular marks), the direction of spin in the magnetic layer of the MTJ element 70 cannot be reversed.

Accordingly, the data write to the MTJ element 70 can be controlled by varying the magnitude of the composite field of the easy-axis field Hx and hard-axis field Hy and changing the position of the magnitude of the composite field in the Hx-Hy plane.

In the above-described prior-art cell architecture shown in FIG. 15, however, the MTJ element 70 is stacked via many metal layers that are provided above the read-out cell select transistor Tr. This complex stacked structure requires many conductor layers and interlayer insulation film, including eight metal wiring layers 18, 15, 19, 16, 20, 17, 23 and 22 and one MTJ element 70. Consequently, a great number of fabrication steps are needed, and it is difficult to provide an MRAM at low cost.

BRIEF SUMMARY OF THE INVENTION

According to an aspect of the present invention, there is provided a magnetic random access memory in which "0" data and "1" data are associated with resistance values of a non-magnetic layer of a magnetoresistive element, the resistance values being variable depending on orientation of magnetization of a magnetic free layer and a magnetic pinned layer which sandwich the non-magnetic layer, and current is let to flow to first and second write current paths, which are provided close to the magnetoresistive element and are separated from each other, thereby producing a composite write magnetic field, changing a direction of magnetization of the free layer, and thus writing data, wherein the first write current path includes a channel region of an insulated-gate type transistor that is disposed close to the free layer, and the transistor is controlled such that a channel current with a desired magnitude flows in the transistor as a write current when data is written to the magnetoresistive element.

DETAILED DESCRIPTION OF THE INVENTION

Embodiments of the present invention will now be described with reference to the accompanying drawings.

<First Embodiment>

Figure 1:
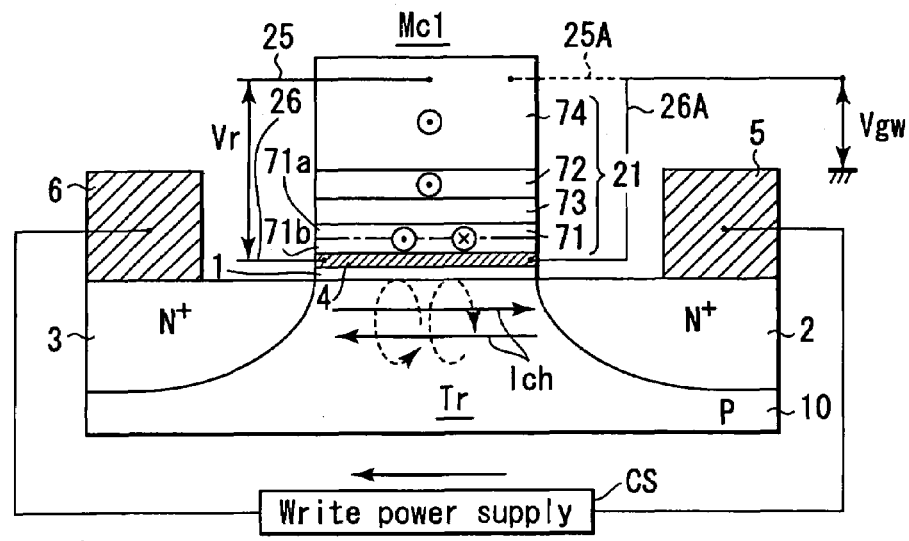
FIG. 1 is a cross-sectional view schematically showing an example of the structure of a memory cell that is used in an MRAM according to a first embodiment of the present invention.

FIG. 1 is a cross-sectional view schematically showing an example of the structure of a memory cell that is used in an MRAM according to a first embodiment of the present invention. In the descriptions below, structural parts common to those shown in FIGS. 14 to 18 are denoted by like reference numerals.

In FIG. 1, reference numeral 10 denotes a semiconductor substrate (P-type Si substrate in this embodiment); 1 a gate oxide film of a transistor Tr (NMOSFET) that is formed in the semiconductor substrate 10; 2 and 3 a drain region and a source region formed of impurity diffusion layers ($N^+$ diffusion layers in this embodiment), which are selectively formed in a surface region of the substrate 10; 4 a gate electrode; and 5 and 6 a drain electrode (contact plug) and a source electrode (contact plug). The drain and source contact plugs 5 and 6 are formed of a first wiring layer.

Reference numeral 21 designates an MTJ element that is provided on top of the gate electrode 4. Like the structure described with reference to FIG. 14, the MTJ element 21 has such a structure that a non-magnetic layer 73 is interposed between a free layer 71 and a pinned layer 72 which are formed of magnetic layers. Thus, the MTJ element 21 has a tunneling magnetoresistive effect. An antiferromagnetic layer 74 is disposed on the pinned layer 72.

The MTJ element 21 of this embodiment has a rectangular shape, and each of the magnetic layers is formed of a magnetic material such as NiFe, CoFe, CoCr or CoPt. The direction of spin of the magnetic layers is set in the longitudinal direction of the rectangular shape of the MTJ element 21. In this embodiment, the direction of spin is perpendicular to the sheet surface of FIG. 1. To be more specific, the longitudinal direction coincides with a channel width direction of the transistor Tr, and the transverse direction coincides with a channel length direction of the transistor Tr.

Reference numeral 25 denotes a first connection wiring (upper wiring in this embodiment) that is connected to the pinned layer 72 via the antiferromagnetic layer 74 (upper side in this embodiment) of the MTJ element 21, and numeral 26 denotes second connection wiring (lower wiring in this embodiment) that is connected to the gate electrode 4 under the free layer 71 side (lower side in this embodiment) of the MTJ element 21.

As will be described later, at a time of data read-out, a read-out voltage Vr is applied between the upper wiring 25 and lower wiring 26 via the MTJ element 21. At a time of data write, the upper wiring 25 or the lower wiring 26 functions as one of current paths for data write. The transistor Tr for data write is connected to a write power supply CS such that when data-is written in the MTJ element 21, a channel current Ich of a desired magnitude may flow as a write current between the source and drain electrodes 6 and 5 of the transistor Tr. A voltage is applied in a predetermined direction to the transistor Tr according to the contents of the data being written.

The material of the gate electrode 4 is not limited, if it does not adversely affect the function of applying a magnetic field, which is generated by the channel current of the transistor Tr, to the free layer 71 of the MTJ element 21, as will be described later. The material of the gate electrode 4 is not limited to an impurity-doped polysilicon which is known as a polysilicon gate. For example, a metal silicide layer may be provided on an upper surface of the polysilicon gate, or a metal gate of, e.g. tantalum (Ta), which is adopted in some types of MISFETs, may be employed as the lower wiring 26.

In this embodiment, the gate electrode 4 is configured such that a metal silicide layer is formed on an upper surface of a polysilicon gate. That part of the metal silicide layer, which is other than the part functioning as a part of the gate electrode 4, is used as part of the lower wiring 26 connected to the MTJ element 21. For channel on/off control, a gate voltage may be applied. In this case, such modification may be made that a gate voltage for controlling the on/off state of the transistor Tr at the time of data write (to be described later) is applied to the entire MTJ element 21, as indicated by solid and broken lines. In this way, a memory cell Mc1 of an MRAM is formed.

Specifically, the memory cell Mc1 shown in FIG. 1 is configured such that the MTJ element 21 is provided on top of the gate electrode 4 of the transistor Tr, which is formed on the semiconductor substrate 10. In other words, two write current paths, i.e. the lower wiring 26 connected to the gate electrode 4 and the channel region of the transistor Tr, are provided so as to be adjacent to the free magnetic layer 71 on one side of the MTJ element 21 that is formed on the semiconductor substrate 10. Alternatively, the upper wiring 25 and the channel of the transistor Tr may be used as the two write current paths.

Figure 16:
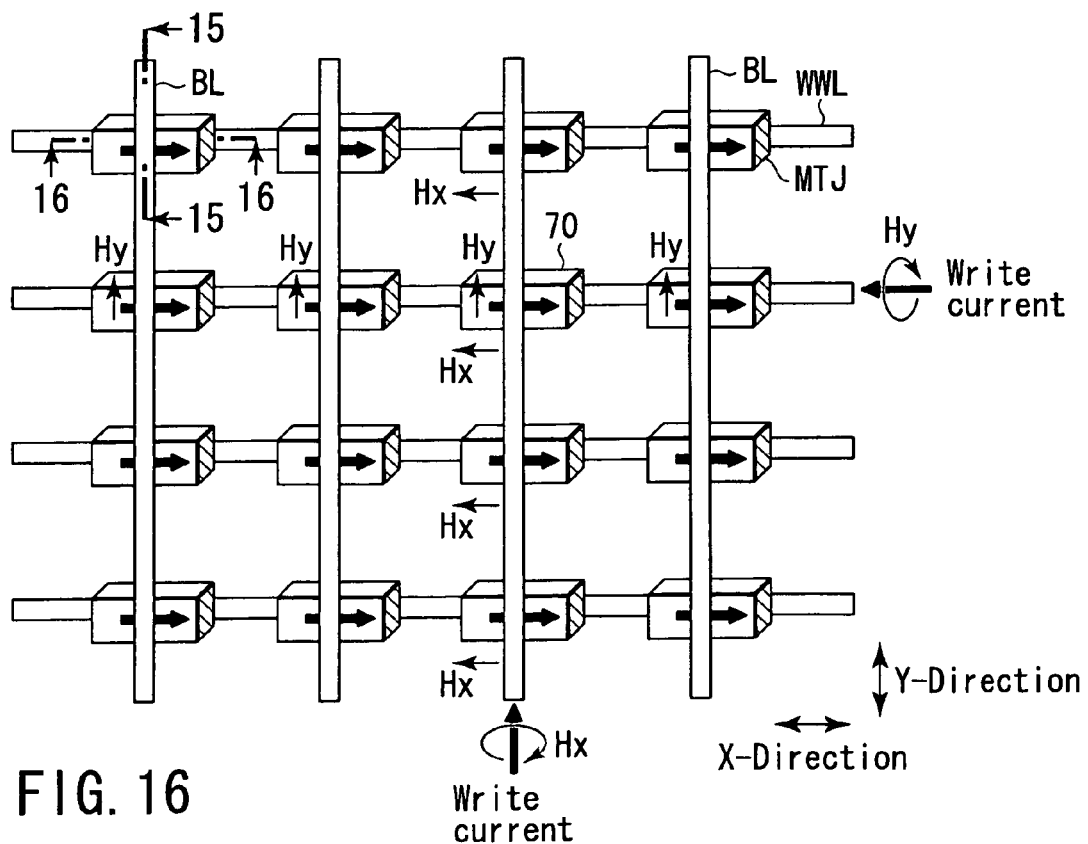
FIG. 16 schematically shows an example of a plan-view layout of a memory cell array of an MRAM that incorporates conventional memory cells.
Figure 17:
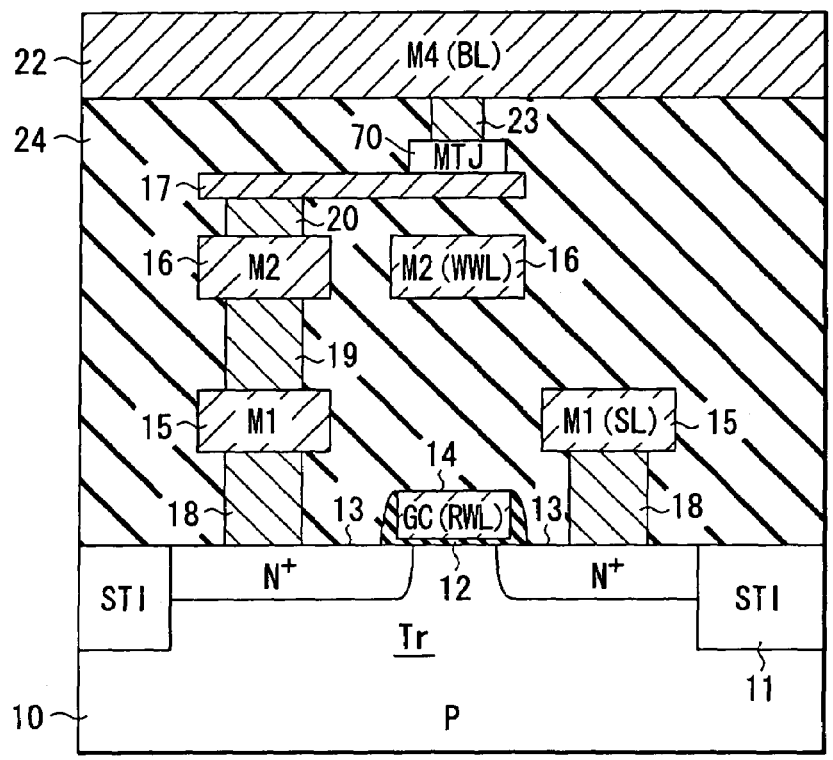
FIG. 17 is a cross-sectional view showing an example of the structure of, in particular, one memory cell in a cross section perpendicular to a write word line shown in FIG. 16.
Figure 18:
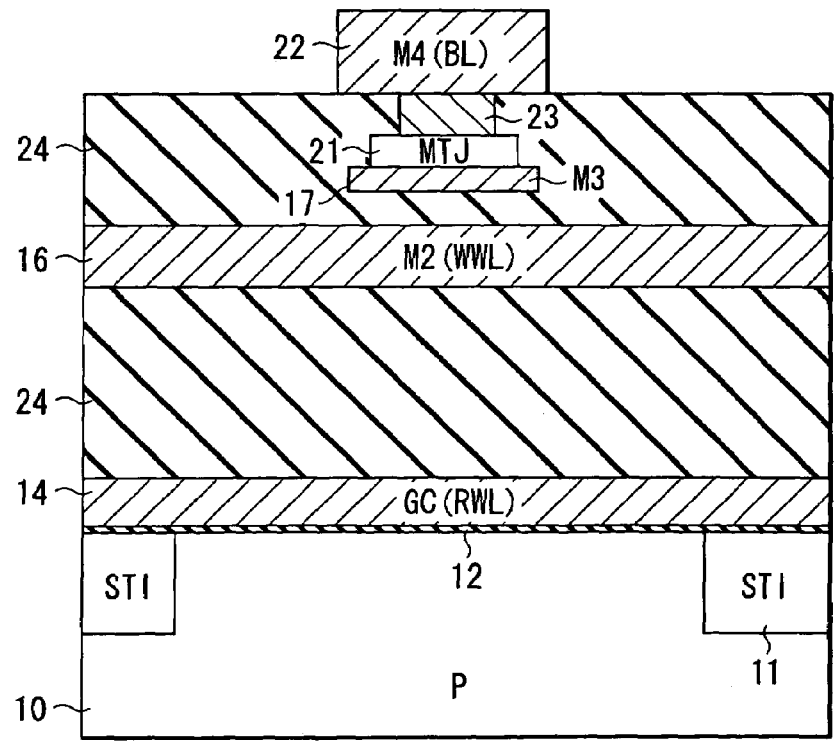
FIG. 18 is a cross-sectional view showing an example of the structure of the memory cell in a cross section perpendicular to a bit line shown in FIG. 16.
Figure 19:
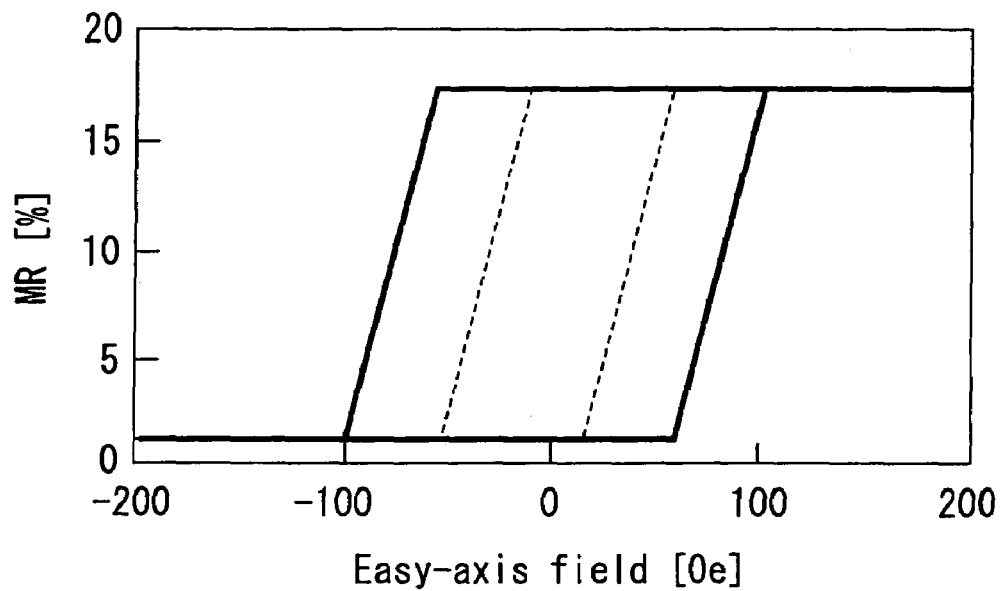
FIG. 19 shows variation characteristics of resistance value due to reversal of applied field in the MTJ element shown in FIG. 14.
Figure 20:
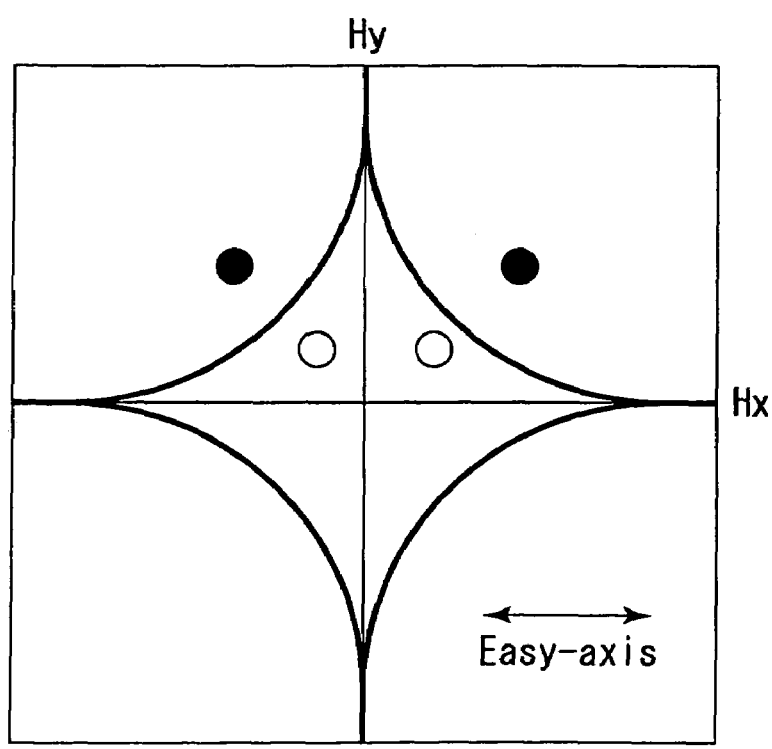
FIG. 20 shows an asteroid curve of the MTJ element shown in FIG. 14.

A memory cell array can be formed by arranging a plurality of memory cells each having the structure of the cell Mc1 shown in FIG. 1 in a matrix form on the semiconductor substrate 10, for example, in the similar manner as shown in FIG. 16.

When memory cells each having a structure of the memory cell Mc1 shown in FIG. 1 are arranged to form the memory cell array, in the similar manner as shown in FIG. 16, the source and drain electrodes 5 and 6 of the transistor Tr of each MTJ element 21 are connected in series in the write word line WWL shown in FIG. 16, for example. Where necessary, the gate electrode 4 of transistor Tr is connected as part of the bit line BL shown in FIG. 16.

In addition, Cu wiring, for instance, is formed as the upper wiring 25 so as to be continuous commonly to the MTJ elements 21 of memory cells Mc1 in the same row. Further, metal wiring is formed as the word line WWL so as to be continuous in series to the drain electrode 5 and source electrode 6 of the transistor Tr. The transistor Tr functioning as a write current path device is connected to the metal wiring.

When data write mode, as will be described later, a predetermined current is made flow through the lower wiring 26. At the time of data read-out a voltage Vr is applied between the lower wiring 26 and the upper wiring 25 as a read-out voltage that produces a data read path through the MTJ element 21. The voltage Vr is used as a bit line select voltage for selecting the memory cell Mc1.

In this way, the write word lines WWL and bit lines BL are arranged perpendicular to each other, and the MTJ elements 21 are disposed at intersections of these lines. The MTJ element 21 is disposed such that the direction of spin is set in the width direction of the gate electrode 4.

Assuming that the memory cell Mc1 having the structure shown in FIG. 1 is selected at the-time of data write and data read-out. The write and read operations of the memory cell Mc1 will be described. In the description below, arrows indicate the directions of current or magnetic field, which are parallel to the sheet surface of the Figures. An encircled "X" mark indicates the direction of current or magnetic field that is perpendicular to, and extends away from, the sheet surface of the drawing. In addition, an encircled dot "●" mark indicates the direction of current or magnetic field that is perpendicular to, and extends toward, the sheet surface of the drawing.

When data is written to the selected memory cell Mc1, a positive write voltage Vgw is applied between the lower wiring 26A, which is connected to the gate electrode 4 of the transistor Tr and the ground. Specifically, in order to turn on the transistor Tr at a maximum level, a gate voltage Vgw that is higher than a predetermined value is applied via the wiring 26A between the gate electrode 4, which corresponds to the MTJ element 21, and the ground potential. Further, as indicated by the broken line, the same voltage Vgw may also be applied to the upper wiring 25A in addition to the wiring 26A. As a result, a magnetic field that is generated by the current flowing in the gate electrode 4 is applied to the free layer 71. At the same time, the write power supply CS causes a channel current Ich (write current), which has a magnitude enough to produce a composite magnetic field that is greater than a write threshold of the MTJ element 21 in combination of the field generated at the gate electrode 4, to flow between the drain electrode 5 and source electrode 6. In this case, the write power supply CS applies a potential difference, which has a polarity corresponding to write data "1" or "0", between the drain 5 and source 6. In addition, the write power supply CS supplies a write current Ich in a direction of "drain 5→source 6" or in a direction of "source 6→drain 5", in accordance with write data "1" or "0". As a result, the direction of spin in the free layer 71 is set toward, or away from, the sheet surface of FIG. 1, depending on the direction of a composite magnetic field produced by the field generated by the current flowing in the gate electrode 4 and the field produced by the channel current Ich.

The direction of spin in the free layer 71 can be changed by controlling the direction of the field generated by the channel current Ich that flows in the channel of the transistor Tr. In this case, for example, a current perpendicular to the channel current Ich is let to flow to the gate electrode 4 via the lower wiring 26. Thus, it is the direction of the channel current Ich that determines the direction of spin in the free layer 71.

As has been described above, the gate current and channel current Ich, which flow in directions perpendicular to each other, are supplied as write currents, and the resultant magnetic fields produce a composite magnetic field. For example, the direction of magnetization of the free layer 71 of the MTJ element 21 is changed in accordance with the direction of the channel current Ich, thereby writing data. In this case, the two directions of spin in the pinned and free layers 72, 71 which are defined in the longitudinal direction of the MTJ element 21 along the width direction of the gate electrode 4 (lower wiring 26, 26A), are parallel or antiparallel. Data erasure is performed in the same manner as the data write.

Figure 13:
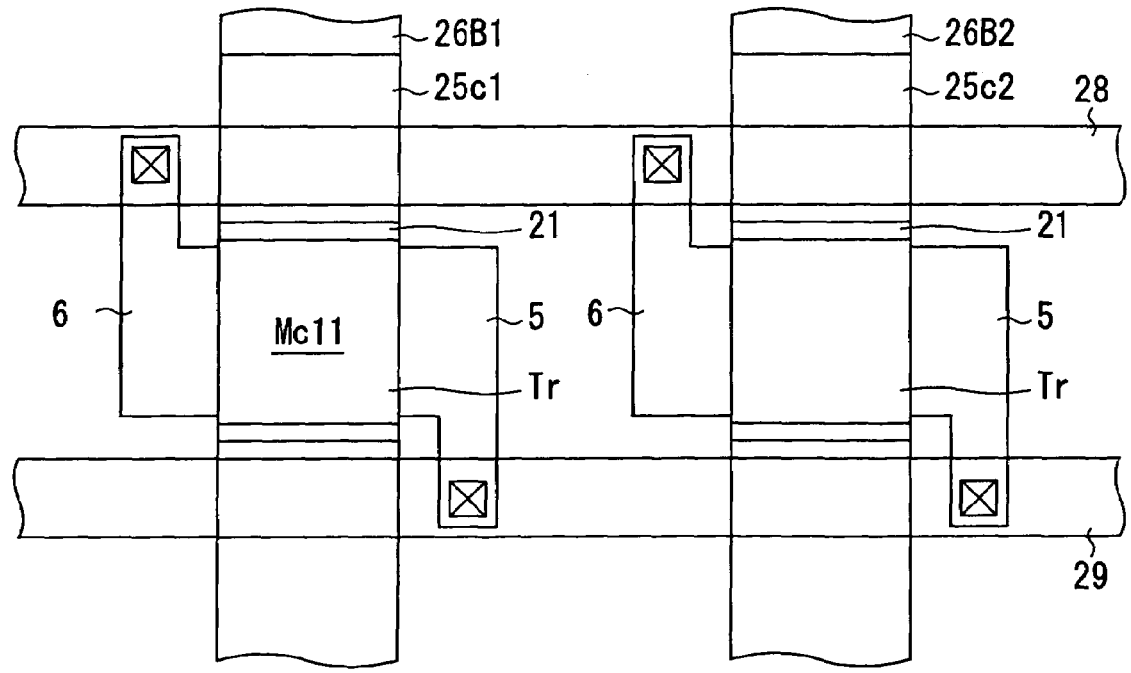
FIG. 13 schematically shows an example of a plan-view layout of a memory cell array of an MRAM shown in the embodiment of FIG. 12.
Figure 14:
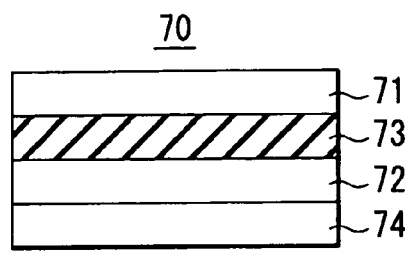
FIG. 14 is a cross-sectional view schematically showing a general architecture of an MTJ element that is used in a conventional MRAM.
Figure 15A:
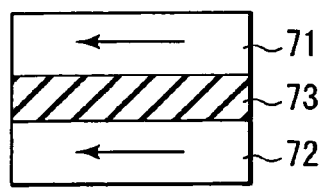
FIG. 15A shows directions of spin in two magnetic layers of the MTJ element shown in FIG. 14.
Figure 15B:
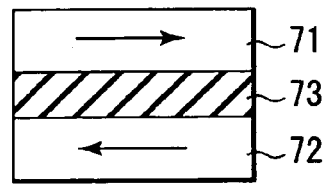
FIG. 15B shows directions of spin in the two magnetic layers of the MTJ element shown in FIG. 14.

The longitudinal dimension of the MTJ element 21 may be set to be equal or greater than the channel width of the transistor Tr as shown in the embodiment of FIG. 13, for example. The greater width of the element 21 can enhance the intensity of the magnetic field that is applied to the end portions of the free layer 71 in the length direction of the MTJ element 21.

In the embodiment shown in FIG. 1, at the time of data read-out, the application voltage to the gate electrode 4 is kept at a low level or zero so as to turn off the transistor Tr.

When data is read out the read voltage Vr is applied between the upper wiring 25 and the lower wiring 26 at a selected memory cell Mc1 at a cross point of the wiring 25 and the transistor Tr. The read-out voltage Vr is applied between the upper wiring 25, which functions as a read-out bit line, and lower wiring 26, so that a read-out current may flow to a sense amplifier (not shown) connected to the upper wiring 25 via the MTJ element 21 of the memory cell Mc1. Consequently, a read-out current corresponding to the magnetoresistance value of the MTJ element 21 flows through the MTJ element 21 to the sense amplifier. Thus, the current value is detected by the sense amplifier that is connected to the read-out bit line or the upper wiring 25, and data can be read out.

According to the present embodiment, the current flowing in the gate electrode 4 or the upper wiring 25 and the channel current of the transistor Tr are used as write currents. This makes it unnecessary to provide fabrication steps of forming dedicated metal wiring layers (e.g. write word line WWL in FIG. 15) and via-contact layers for contact with it, which are required in the prior art. The number of fabrication steps for the metal wiring layers can be reduced.

The gate electrode 4 may be formed as a part of the lower wiring 26. Thus, only two metal layers (i.e. first metal layer for drain contact 5 and source contact 6, and second wiring layer for upper wiring 25) are required. The number of fabrication steps for the metal wiring layers can greatly be decreased, and the manufacturing cost can remarkably be reduced.

At the time of data write, a current may be let to flow to the upper wiring 25, too. Using a composite magnetic field that is generated by this current and channel current, data write is also performed. Thus, the value of the channel current that is necessary for write can be decreased. As a result, the size of the transistor Tr can be reduced, the cell size can be reduced, and the manufacturing cost can further be reduced.

<Second Embodiment>

The first embodiment can be modified such that the transistor Tr may also be used when data is read-out from the memory cell. An example of this architecture is described as a second embodiment of the invention.

Figure 2:
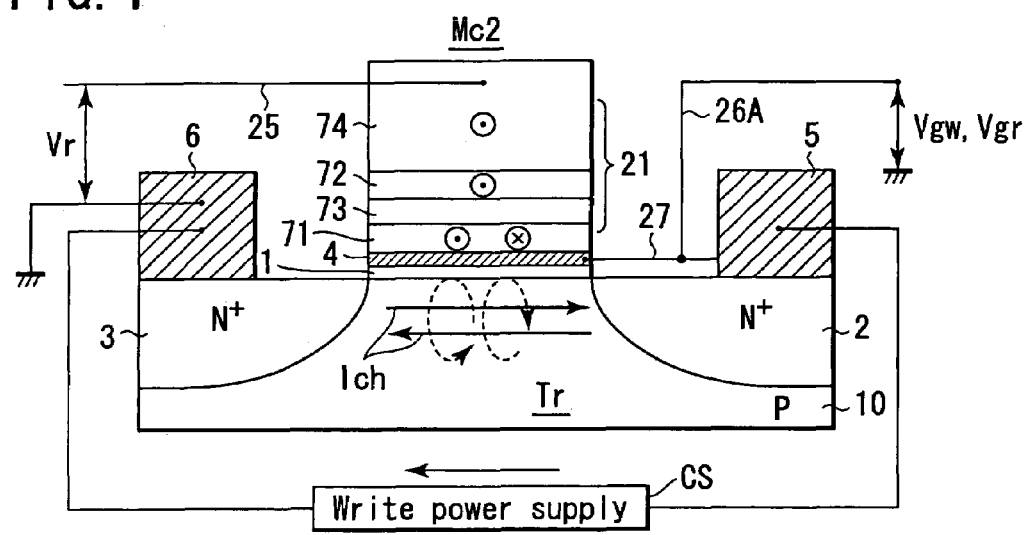
FIG. 2 is a cross-sectional view schematically showing an example of the structure of a memory cell that is used in an MRAM according to a second embodiment of the invention.

FIG. 2 is a cross-sectional view schematically showing an example of the structure of a memory cell Mc2 that is used in an MRAM according to the second embodiment of the invention.

In the memory cell Mc2, compared to the memory cell Mc1 of the first embodiment, a lower wiring 27, which is connected to the gate electrode 4 provided under the MTJ element 21, is electrically connected to one end of the transistor Tr, for example, the drain electrode 5. A tantalum (Ta) film formed as the gate electrode 4, for instance, may be commonly used as connection wiring for the lower wiring 27. The lower wiring 26A in FIG. 1 is connected to the lower wiring 27. Since the structure in FIG. 2 is the same as that in FIG. 1 in the other respects, the common parts are denoted by like reference numerals.

In the operation of data write to the memory cell Mc2, a high write voltage Vgw that is higher than a predetermined value is applied via the lower wiring 26A, 27, which is the gate wiring, between the gate electrode 4 and the ground potential. Thereby, the transistor Tr is turned on, and the write power supply CS produces a write channel current Ich in a predetermined direction between the drain electrode 5 and source electrode 6 in the transistor Tr, in addition to the current flowing through the gate electrode 4, so as to produce a composite magnetic field.

On the other hand, in the read-out operation, a read-out gate voltage Vgr, which is lower than the write gate voltage Vgw, is applied to turn on the transistor Tr. In addition, a predetermined read-out voltage Vr is applied between the upper wiring 25 and source electrode 6, and a read-out current from the MTJ element 21 flows, for example, in the following current path: sense amplifier (not shown)→upper wiring 25→MTJ element 21→gate electrode 4→drain electrode 5→channel of transistor Tr→source electrode 6→ground.

As has been described above, according to the structure wherein the transistor Tr is connected in series to the MTJ element 21, the single transistor Tr can be used commonly as the write transistor and the read-out transistor for forming the read-out current path via the MTJ element 21.

<Third Embodiment>

Figure 3:
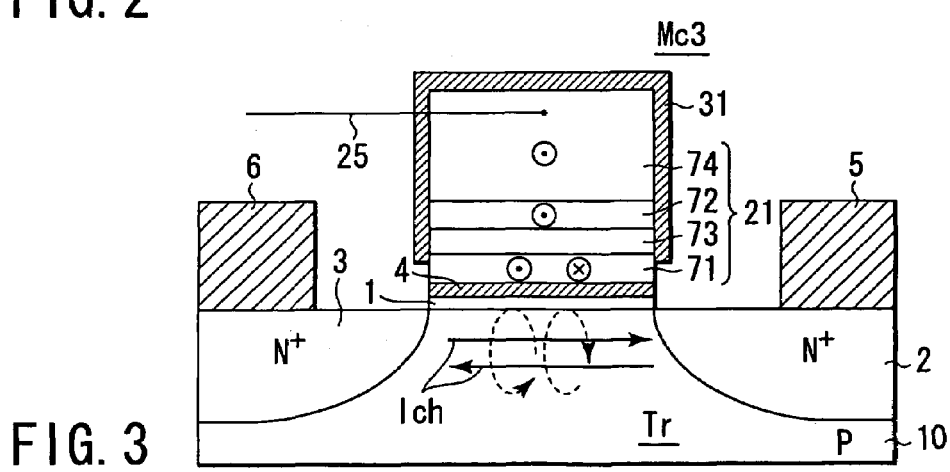
FIG. 3 is a cross-sectional view schematically showing an example of the structure of a memory cell that is used in an MRAM according to a third embodiment of the invention.

FIG. 3 is a cross-sectional view schematically showing an example of the structure of a memory cell Mc3 that is used in an MRAM according to a third embodiment of the invention.

The memory cell Mc3 differs from the memory cell Mc1 of the first embodiment in that a soft magnetic layer 31 of, e.g. NiFe or CoZrNb is coated on at least a part of the surfaces of the MTJ element 21 (an upper surface and side surfaces in this embodiment as shown in the figure). In this case, the soft magnetic layer 31 is used as a yoke and covers most of surfaces of the MTJ element 21, except the side surfaces of the free layer 71. Since the structure in FIG. 3 is the same as that in FIG. 1 in the other respects, the common parts are denoted by like reference numerals.

According to this structure, in the data write operation, a larger magnetic field generated by the current flowing in the upper wiring 25 is imparted to the free layer 71. Accordingly, the value of channel current Ich (threshold of write current) of the transistor Tr, which is required for data write, can be decreased. As a result, for example, the channel width of the write transistor Tr can be reduced, the cell size can be reduced, and the manufacturing cost can further be reduced. Although not shown, in this third embodiment, too, the write power supply is connected as in the embodiments of FIGS. 1 and 2. In embodiments of FIGS. 4 to 7 that are to be described below, the write power supply, though not shown, is similarly connected.

<Fourth Embodiment>

In the first to third embodiments, the direction of magnetization of the free layer 71 of MTJ element 21 is perpendicular to the direction of channel current (i.e. gate width direction of gate electrode 4). However, the direction of magnetization of the free layer 71 of MTJ element 21 may be set to be parallel to the direction of channel current (i.e. channel length direction). An embodiment is described below.

Figure 4:
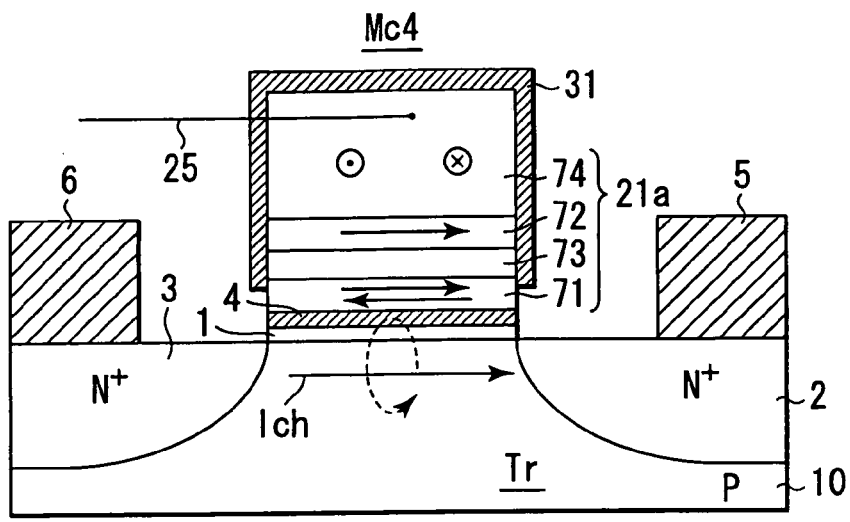
FIG. 4 is a cross-sectional view schematically showing an example of the structure of a memory cell that is used in an MRAM according to a fourth embodiment of the invention.

FIG. 4 is a cross-sectional view schematically showing a structure of a memory cell Mc4 that is used in an MRAM according to a fourth embodiment of the invention.

The memory cell Mc4 differs from the memory cell Mc3 in that the MTJ element 21a is disposed such that the directions of magnetization of the free layer 71 and pinned layer 72 coincide with the channel length direction of the transistor Tr. Since the structure in FIG. 4 is the same as that in FIG. 3 in the other respects, the common parts are denoted by like reference numerals.

With the above structure, when data is written, a channel current Ich, which is in parallel to the sheet surface of FIG. 4, is caused to flow in the transistor Tr of the selected memory cell Mc4. In addition, a current with a predetermined magnitude to form a composite magnetic field with the channel current Ich exceeding a write threshold of the MTJ element 21a is caused to flow in the upper wiring 25 including the antiferromagnetic layer 74 in a direction perpendicular to the sheet surface of FIG. 4 in accordance with write data "1" or "0". Thereby, the direction of magnetization or spin of the free layer 71 of MTJ element 21a can be switched. Thus, the current Ich that flows in the channel of the transistor Tr can be fixed to one direction, as shown in FIG. 4.

<Fifth Embodiment>

Figure 5:
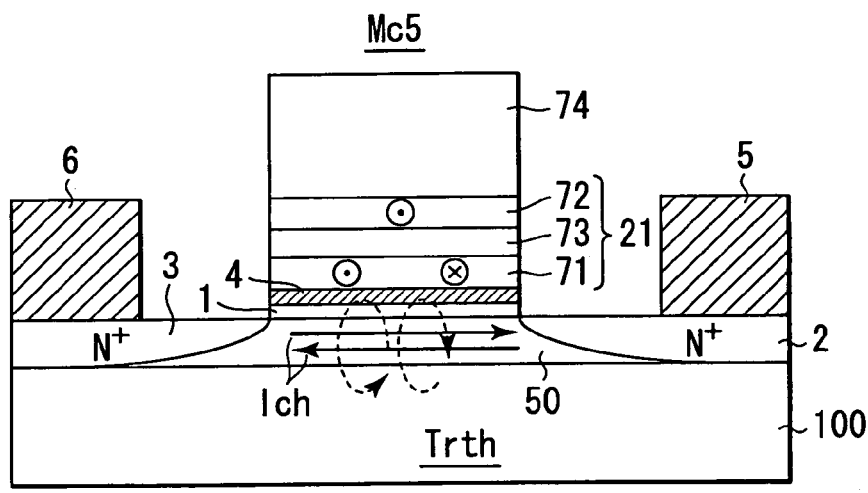
FIG. 5 is a cross-sectional view schematically showing an example of the structure of a memory cell that is used in an MRAM according to a fifth embodiment of the invention.

FIG. 5 is a cross-sectional view schematically showing a structure of a memory cell Mc5 that is used in an MRAM according to a fifth embodiment of the invention.

The memory cell Mc5 differs from the memory cell Mc1 of the first embodiment in the following respects. The semiconductor substrate is formed as, e.g. SOI (silicon on insulator). Specifically, the semiconductor substrate is a semiconductor layer 50 formed on an SOI substrate 100 made of an insulator such as glass. A thin-film transistor Trth is formed on the semiconductor substrate 50 as a transistor for providing a channel current Ich. In the other respects, the structure in FIG. 5 is the same as that in FIG. 1, and the common parts are denoted by like reference numerals.

According to the fifth embodiment, an array of thin-film transistors Trth can be stacked on, e.g. an underlying logic circuit section that is formed on a semiconductor substrate. Therefore, a so-called system-on-silicon structure can easily be formed at low cost.

<Sixth Embodiment>

Figure 6:
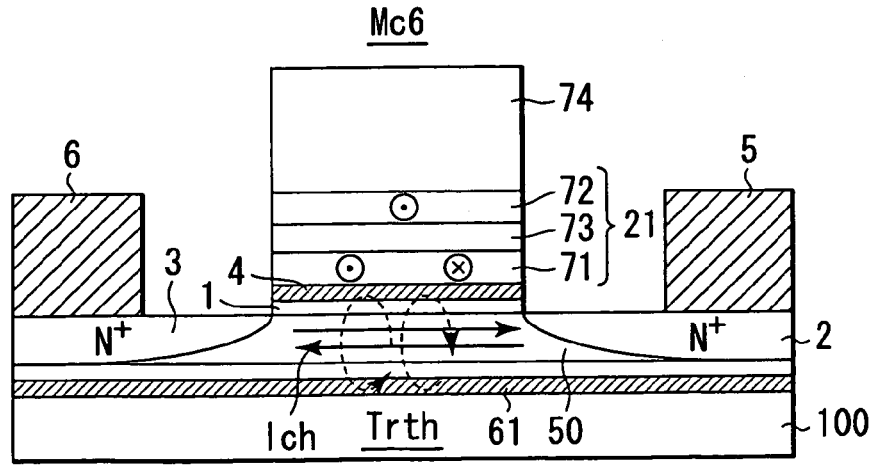
FIG. 6 is a cross-sectional view schematically showing an example of the structure of a memory cell that is used in an MRAM according to a sixth embodiment of the invention.

FIG. 6 is a cross-sectional view schematically showing a structure of a memory cell Mc6 provided in an MRAM according to a sixth embodiment of the present invention.

The memory cell Mc6 differs from the memory cell Mc5 of the fifth embodiment in that a soft magnetic film 61 made of NiFe or CoZrNb is disposed under the thin-film transistor Trth. The soft magnetic film 61 is buried under the entire surface of the SOI substrate 100. In the other respects, the structure in FIG. 6 is the same as that in FIG. 5, so the common parts are denoted by like reference numerals.

According to this structure, the soft magnetic film 61 is disposed such that the region of the semiconductor substrate 50 where the channel region of the transistor Trth is formed is sandwiched between the soft magnetic layer 61 and the MTJ element 21. Thus, the composite magnetic field generated by the channel current Ich as well as the current flowing in the gate electrode 4 or in the layer 74 and acting on the free layer 71 in the write operation, for example, can greatly be enhanced. As a result, the magnitude of the channel current Ich can remarkably be decreased, and the size, e.g. channel width, of the transistor Trth can further be reduced.

<Seventh Embodiment>

Figure 7:
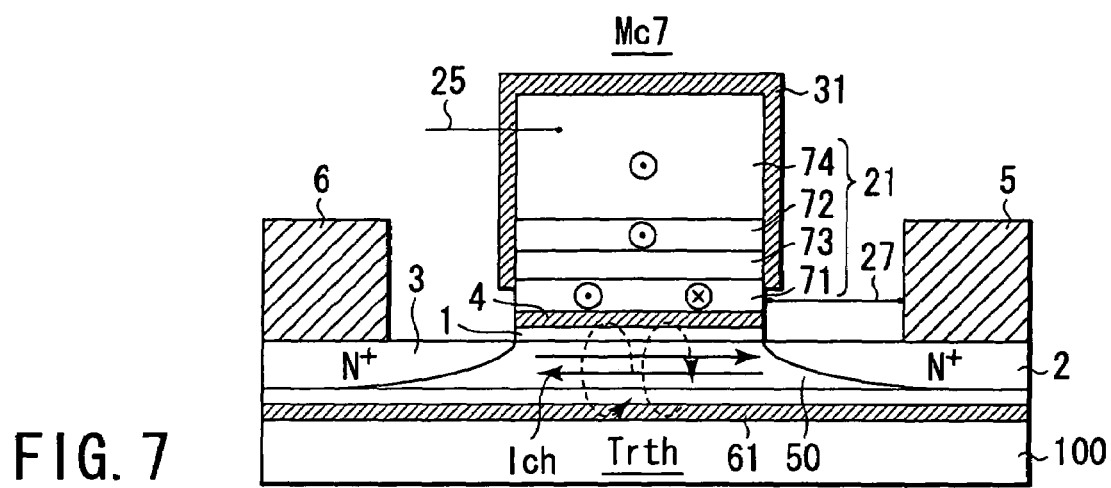
FIG. 7 is a cross-sectional view schematically showing an example of the structure of a memory cell that is used in an MRAM according to a seventh embodiment of the invention.

FIG. 7 is a cross-sectional view schematically showing a structure of a memory cell Mc7 that is used in an MRAM according to a seventh embodiment of the present invention.

The memory cell Mc7 differs from the memory cell Mc1 of the first embodiment shown in FIG. 1 in the following respects:

(1) Like the embodiment shown in FIG. 3, a yoke of soft magnetic film 31 made of, e.g. NiFe or CoZrNb is coated on at least a part of the surfaces of the MTJ element 21 (an upper surface and side surfaces in this embodiment);

(2) A thin-film transistor Trth is formed on the semiconductor layer 50 as the write current supply transistor;

(3) A soft magnetic film 61 made of, e.g. NiFe or CoZrNb, is disposed in the SOI substrate 100 under the thin-film transistor Trth; and (4) Wiring 27 that is connected to the free layer 71 of MTJ element 21 is provided separately from the gate electrode 4, and the wiring 27 that is connected to the free layer 71 of MTJ element 21 is electrically connected to one end of the transistor Trth, e.g. the drain electrode 5.

In the other respects, the structure in FIG. 7 is the same as that in FIG. 1, so the common parts are denoted by like reference numerals. A magnetic film for forming the free layer 71 may be extended to the drain electrode 5 as the connection wiring 27.

When data is written to the memory cell Mc7 with the above structure, a current with a sufficient magnitude exceeding a write threshold of the MTJ element 21a together with the current flowing in the layer 74, for example, is required to flow as the channel current Ich of the transistor Trth, like the first embodiment. Hence, it is necessary to set the transistor Trth in the full turn-on state, and the gate voltage is set at a value that is necessary for fully driving the transistor Trth.

At the time of read-out, the potential in the gate electrode 4 is set in the on-state in which a read-out current, which is less than the write current for the MTJ element 21 by an order of magnitude or more, flows as the channel current of the transistor Trth. Although not shown in FIG. 7, the read-out path is the same as in the embodiment of FIG. 2. At times other than the write/read/erasure modes, the gate voltage of the gate electrode 4 is set in the off-state in which no channel current Ich flows in the transistor Trth.

Since the selected MTJ element 21 can be separated from the other memory cells not only at the write time but also at the read-out time, the read-out speed can be increased.

<Modification>

Figure 8:
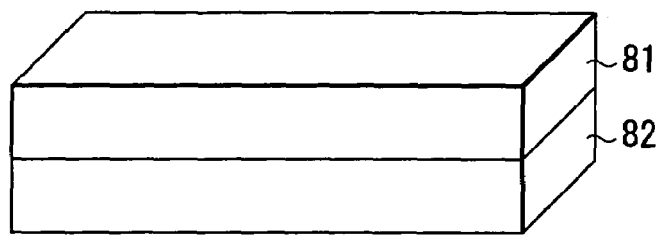
FIG. 8 is a perspective view showing a memory module according to an example of application of the MRAM of the invention.

FIG. 8 is a perspective view showing a memory module according to an example of application of the MRAM according to each embodiment of the invention.

The memory module includes a memory chip 81 that is configured such that a given number of memory cell arrays configured according to one of the embodiments of the present invention are stacked on a semiconductor substrate in order to increase the memory capacity. The memory chip 81 is stacked on a driver chip 82 wherein driver circuits for cell section are formed on a semiconductor substrate. A logic chip wherein logic circuits formed on a semiconductor substrate for write/read control of the memory chip 81 may also be substituted for the driver chip 82. The stacked structure is packaged as a memory module as shown in FIG. 8.

According to this memory module, the structures of the chips 81 and 82 are simplified. Thus, the manufacturing yield of each chip 81, 82 and the yield of the entire module are improved, and the manufacturing cost can further be reduced.

Figure 9:
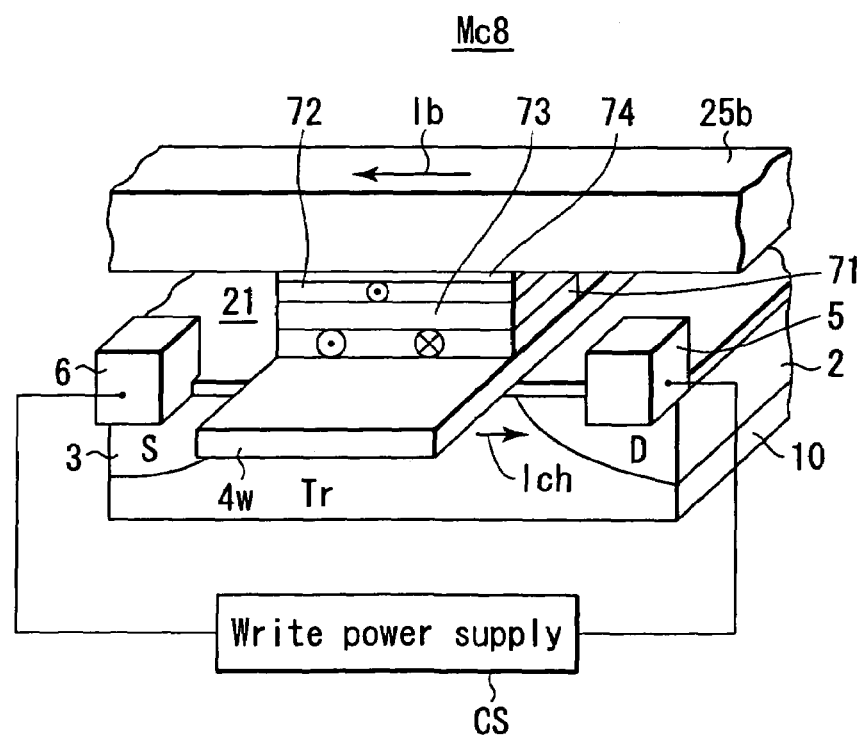
FIG. 9 is a cross-sectional view schematically showing an example of the structure of a memory cell that is used in an MRAM according to an eighth embodiment of the invention.
Figure 10:
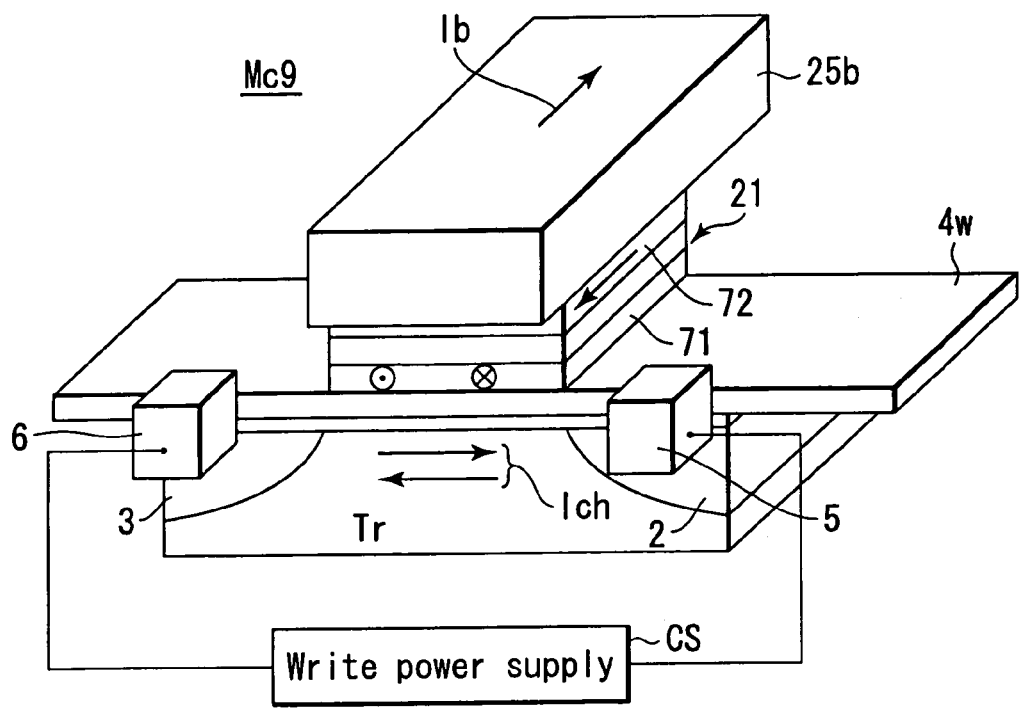
FIG. 10 is a cross-sectional view schematically showing an example of the structure of a memory cell that is used in an MRAM according to a ninth embodiment of the invention.
Figure 11:
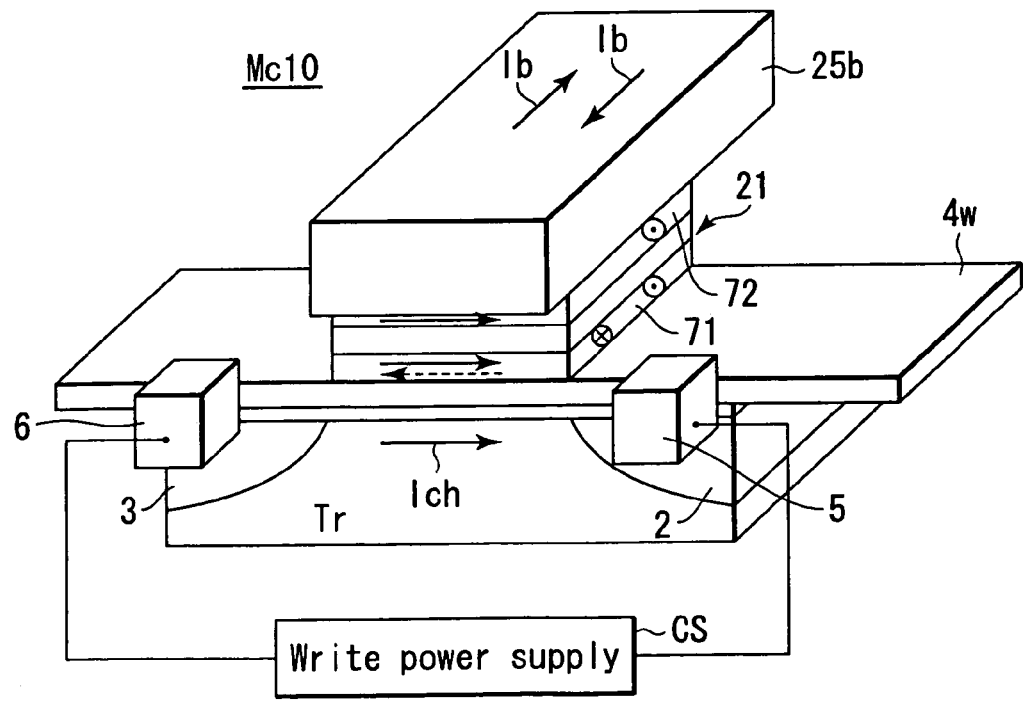
FIG. 11 is a cross-sectional view schematically showing an example of the structure of a memory cell that is used in an MRAM according to a tenth embodiment of the invention.

Next, referring to FIGS. 9 to 11, the basic architectures and operations of memory cells according to still further embodiments of the present invention will now be described in detail. In FIGS. 9 to 11, the structural components common to those in FIGS. 1 to 7 are denoted by like reference numerals and symbols.

<Eighth Embodiment>

In FIG. 9, a word line 4w that extends in the channel width direction is provided on the channel region of the transistor Tr via a gate insulation film 1. A free layer 71 of the MTJ element 21 is provided in contact with the upper surface of the word line 4w. A bit line 25b, which extends in a direction perpendicular to the word line 4w, is provided in contact with the upper surface of an antiferromagnetic layer 74 that is formed on a pinned layer 72 of the MTJ element 21. The direction of spin in the pinned layer 72 is set to be perpendicular to, and extends toward, the sheet surface of FIG. 9. The word line 4w is disposed along the direction of spin of the free layer 71 and pinned layer 72.

At the time of manufacture, a drain contact 5 and a source contact 6 are formed as first metal wiring in contact with the surfaces of a drain region 2 and a source region 3 formed in the semiconductor substrate 10. Subsequently, a 4-layer MTJ element 21 is formed on the word line 4w. After the entire surface of the substrate 10 is covered with an interlayer insulation film (not shown), the antiferromagnetic layer 74 is exposed and the bit line 25b is formed. Thus, the basic structural part of the memory cell McB of this embodiment is formed.

In the embodiment shown in FIG. 9, the direction of spin of the pinned layer 72 is perpendicular to, and extends toward, the sheet surface of FIG. 9. Assume that the direction of spin of the free layer 71 is opposite to that of the pinned layer 72 and is perpendicular to, and extends away from, the sheet surface of FIG. 9.

In the state in which a predetermined potential difference is provided by the write power supply CS between the drain region 2 and source region 3, a "HIGH" gate voltage is applied to the word line 4w that is selected by an address decoder (not shown). As a result, a channel current Ich flows in the transistor Tr, for example, in the direction of the arrow in FIG. 9. By the channel current Ich, a magnetic field in the direction toward the sheet surface of FIG. 9 is applied to the free layer 71.

On the other hand, a bit line current Ib flows in the bit line 25b, which is selected by an address decoder (not shown), in the direction of the arrow in FIG. 9. A magnetic field that is generated by the bit line current Ib is applied to the free layer 71 in the direction toward the sheet surface of FIG. 9. As a result, a composite field of the two magnetic fields is applied to the free layer 71, and the direction of spin of the free layer 71 is reversed to become the direction toward the sheet surface of FIG. 9. Thus, data is written in the memory cell Mc8.

At the time of read-out, the voltage at the word line 4w is decreased to a "LOW" level, and the transistor Tr is set in the off-state. If the cell Mc8 is selected in this state, a voltage is applied between the bit line 25b and word line 4w. At this time, the directions of spin in the pinned layer 72 and free layer 71 are parallel, and the resistance value in the MTJ element 2 is low. A read-out current flows through the MTJ element 21. The read-out current is fed to the sense amplifier (not shown) via the bit line 25b, and data is read out of the cell Mc8. On the other hand, when the directions of spin in the pinned layer 72 and free layer 71 are antiparallel, the resistance of the MTJ element 21 is high and the read-out current is low. Thus, data corresponding to this state is read by the sense amplifier.

<Ninth Embodiment>

Next, referring to FIG. 10, the structure and operation of a memory cell Mc9 according to another embodiment of the invention is described. In the embodiment of FIG. 10, a word line 4w extends in the channel length direction of the transistor Tr. A drain contact 5 and a source contact 6 are formed on the drain region 2 and source region 3 at such positions that the drain contact 5 and source contact 6 are not in contact with the word line 4w. On the other hand, the bit line 25b is formed to extend in the width direction of the transistor channel that is perpendicular to the bit line 25b. The MTJ element 21 is sandwiched between the word line 4w and bit line 25b at the intersection of the word line 4w and bit line 25b such that the MTJ element 21 corresponds in position to the channel region of the transistor Tr. In this case, the directions of spin in the pinned layer 72 and free layer 71 are perpendicular to the sheet surface of FIG. 10, like the case-shown in FIG. 9.

The embodiment shown in FIG. 10 is configured such that the connection of the drain region 2 and source region 3 can be reversed in relation to the polarity of the write power supply CS. Thus, the relationship in potential between the source and drain is reversed, and the channel current Ich can selectively be set so as to flow in opposite directions in accordance with the polarity of connection of the power supply CS. On the other hand, the direction of the bit line Ib that flows in the bit line 25b is fixed to one direction away form the sheet surface of FIG. 10, as shown in FIG. 10. Like the embodiment shown in FIG. 9, the wiring layers are the drain contact 5, source contact 6, word line 4w, and bit line 25b which, along with the word line 4w, sandwiches the MTJ element 21. Thus, the architecture and the fabrication process are simple.

When data is written to the memory cell Mc9 of FIG. 10, the direction of spin of the free layer 71 is set previously at direction away from the sheet surface of FIG. 10, which is opposite to the direction of spin of the pinned layer 72 as in the case of FIG. 9 embodiment. When a gate voltage is applied from the word line 4w in this state, the transistor Tr is turned on and a channel current Ich flows from the source region 3 to the drain region 2. By the channel current Ich, a magnetic field in a direction away from-the sheet surface of FIG. 10 is generated. At this time, if a bit current Ib in the direction of the arrow flows in the bit line 25b, the bit current Ib produces a magnetic field perpendicular to the direction of spin of the free layer 71. These orthogonal magnetic fields are combined to produce a composite field. If a component of the composite field, which is in the toward direction opposite the previously set direction of spin of the free layer 71, exceeds a predetermined intensity, the direction of spin is reversed to become a direction toward the sheet surface of FIG. 10. As a result, predetermined data is written. In this case, the magnitude of the bit current Ib may be equal to that of a current Iw that flows in the word line 4w.

When data is to be erased, the polarity of the power supply CS, which applies a voltage between the drain region 2 and source region 3, is reversed, while the bit current Ib is maintained in the same direction as in the write time. As a result, the channel current Ich is reversed, and the generated magnetic field is changed to a direction away from the sheet surface of FIG. 10. Consequently, the direction of the composite field becomes opposite to the direction for data write, and the direction of spin in the free layer 71 is reversed to become a direction away from the sheet surface of FIG. 10. Thus, data is erased.

At the time of data read-out, in the state in which the transistor Tr is in the off-state, a read-out current flows between the bit line 25b and word line 4w, which are selected by address decoders (not shown). A sense amplifier (not shown) connected to the bit line 25b senses the magnitude of current flowing in the MTJ element 21, thus reading out data.

<Tenth Embodiment>

FIG. 11 shows a memory cell Mc10 according to still another embodiment of the invention. In this embodiment, unlike the embodiment shown in FIG. 10, the direction of channel current Ich is fixed to one direction from the source region 3 toward the drain region 2. Instead, the direction of bit current Ib flowing in the bit line 25b is made selectable between two opposite directions. In addition, the directions of spin in the free layer 71 and pinned layer 72 of the MTJ element 21 are set to agree with the channel length direction.

Assume that in the initial state the direction of spin of the free layer 71 is a direction indicated by a broken-line arrow in FIG. 11. At the time of data write, a "HIGH" voltage is applied to the word line 4w that is the gate electrode selected by an address decoder (not shown), thereby turning on the transistor Tr. As a result, a channel current Ich flows in the direction indicated by the arrow in FIG. 11, and a magnetic field perpendicular to the direction of spins of the MTJ element 21 is generated.

On the other hand, if a current flows in the bit line 25b, which is selected by an address decoder (not shown), in the direction toward the sheet surface of FIG. 11, this current produces a magnetic field in a direction opposite to the initial direction of spin of the free layer 71 that is indicated by the solid-line arrow. As a result, a composite field is produced by the magnetic field generated by the current flowing in the bit line 25b and the magnetic field generated by the channel current Ich. If the composite field has a magnitude exceeding a predetermined value, the direction of spin in the free layer 71 changes from the direction of the broken-line arrow to the direction of the solid-line arrow. Thereby, data is written.

In the case of data erasure, in the state in which the transistor Tr is turned on and the channel current Ich flows in the direction indicated by the arrow, a bit current Ib is caused to flow in the bit line 25b in the direction away from the sheet surface of FIG. 11. As a result, a composite field in a direction opposite to the direction for data write is generated, and the direction of spin of the free layer 71 is reversed to become the direction indicated by the broken-line arrow. This is referred to as the direction of erasure.

At the time of read-out, the voltage of the word line 4w that is the gate electrode is lowered to turn off the transistor Tr. In this state, the MTJ element 21, which is sandwiched between the word line 4w and bit line 25b that are selected by address decoders, is selected. The sense amplifier (not shown) connected to the bit line 25b detects the magnitude of the bit current that varies depending on the resistance value of the MTJ element 21, which is determined according to whether the direction of spin of the free layer 71 is the same as the direction of spin of the pinned layer 72. Thus, data is read out.

<Eleventh Embodiment>

Data write may also be performed by merely using a magnetic field generated by the channel current flowing through the transistor Tr instead of the composite magnetic field as in the embodiments of FIGS. 1 to 11.

Figure 12:
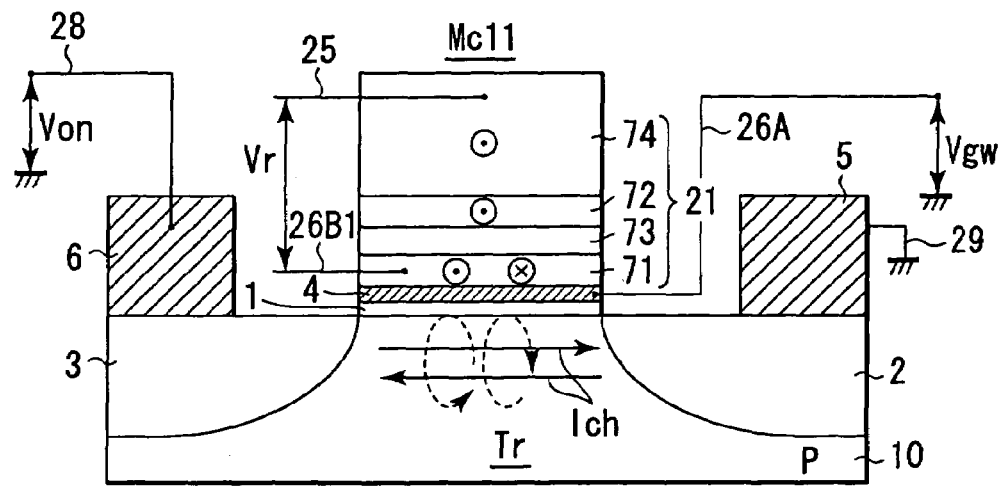
FIG. 12 is a cross-sectional view schematically showing an example of the structure of a memory cell that is used-in an MRAM according to an eleventh embodiment of the invention.

In FIGS. 12 and 13, a plurality of lower wirings 26B1, 26B2 each connected to the gate electrode 4 of the transistors Tr are arranged in one direction. Upper wirings 25c1, 25c2 are arranged above the lower wirings 26B1, 26B2 via MTJ elements 21. A pair of source line 28 and drain line 29 are arranged in a direction crossing the wirings 26B1, 26B2. Source contact 6 of each the transistor Tr is connected to the source line 28 and drain contact is connected to the drain line 29.

Referring to FIGS. 12 and 13, the memory cell Mc11 is selected by selecting the lower wiring 26B1 connected to the gate electrode 4 in the bit line direction. In the word line direction, the source line 28 connected to the source contact 6 of the transistor Tr is selected and a turn-on voltage Von is applied between the source line 28 and the ground line 29 connected to the drain contact 5 of the transistor Tr.

In the data write operation, a gate voltage Vgw is applied to the gate electrode 4 and a write current is applied between the source contact 6 and the drain contact 5 via the source line 28 and the drain line 29 connected to the ground. Thus, in the selected memory cell Mc11, the transistor Tr is turned on to flow a channel current Ich from the write power supply (not shown).

In this case, no magnetic field is generated from the gate electrode 4. A magnetic field enough to determine the direction of the spin in the free layer 71 is generated from the channel current Ich flowing through the transistor Tr.

When the polarity of the write power supply is changed in the reverse direction with respect to the transistor Tr, the polarity of the voltage Von applied between the source and drain lines 28 and 29 may be reversed so that the channel current Ich is reversed to reverse the spin direction of the free layer 71, thereby determining the contents of the data being written in the MTJ element 21.

In the data read operation, a read voltage Vr is applied between the upper wiring 25c1 and the wiring 26B1 connected to the free layer 71 of the MTJ element 21 as shown in FIG. 12. The remaining structure of FIGS. 12 and 13 is similar to that shown in FIG. 1.

The present invention is applicable to a case where the free layer of the MTJ element in each embodiment has a multi-layer structure in lieu of a single-layer structure. For example, the free layer 71 may be made of a first free layer 71a made of a first magnetic material and a second free layer 71b made of a second magnetic material as shown in FIG. 1.

As has been described above, the magnetic random access memory according to the present invention can realize a very simple cell structure, while the manufacturing cost can greatly be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory in which "0" data and "1" data are associated with resistance values of a non-magnetic layer of a magnetoresistive element, the resistance values being variable depending on orientation of magnetization of a magnetic free layer and a magnetic pinned layer which sandwich the non-magnetic layer, and current is let to flow to first and second write current paths, which are provided close to the magnetoresistive element and are separated from each other, thereby producing a composite write magnetic field, changing a direction of magnetization of the free layer, wherein the first write current path includes a channel region of an insulated-gate transistor that is disposed close to the free layer, and the transistor is controlled such that a channel current with a desired magnitude flows in the transistor.

2. The magnetic random access memory according to claim 1, wherein the transistor is connected to a write power supply that is controlled such that the channel current in one of opposite directions corresponding to write data "0" and write data "1" is caused to flow as the write current.

3. The magnetic random access memory according to claim 1, wherein gate wiring continuous with a gate electrode of the transistor is provided as the second write current path, and when data is written to the magnetoresistive element, the gate wiring is supplied with write current in one of opposite directions in accordance with one of write data "0" and write data "1" and the transistor is controlled such that a channel current in a predetermined direction flows as write current that flows in the first write current path.

4. The magnetic random access memory according to claim 1, wherein at least a part of peripheral surfaces of a gate electrode of the transistor is coated with a magnetic material.

5. The magnetic random access memory according to claim 1, wherein the transistor is a thin-film transistor.

6. The magnetic random access memory according to claim 1, wherein the transistor further-functions as a transistor for read-out cell selection.

7. The magnetic random access memory according to claim 6, further comprising first and second read-out voltage application terminals, wherein the first read-out voltage application terminal is connected to one end of the magnetoresistive element, the other end of the magnetoresistive element is connected to one of source and drain electrodes of the transistor via a gate electrode of the transistor, and the other of the source and drain electrodes is connected to the second read-out voltage application terminal.

8. A magnetic random access memory in which "0" data and "1" data are associated with resistance values of a non-magnetic layer of a magnetoresistive element that includes a magnetic free layer and a magnetic pinned layer which sandwich the non-magnetic layer, the resistance values being variable depending on orientation of magnetization of the magnetic free layer and the magnetic pinned layer, and current is let to flow to at least one write current path, which is provided close to the magnetoresistive element, thereby producing a write magnetic field, changing a direction of magnetization of the free layer of the magnetoresistive element, wherein the write current path includes a channel region of an insulated-gate transistor that is disposed close to the free layer of the magnetoresistive element, and the transistor is controlled such that a channel current, which generates a write magnetic field with a magnitude corresponding to a write threshold or more, flows in the transistor as a write current.

9. A magnetic random access memory comprising:
- a wiring formed on a semiconductor substrate;
- a plurality of tunneling magnetoresistive elements disposed along the wiring at intervals, and having a tunneling magnetoresistive effect that is obtained by such a structure that a non-magnetic layer is sandwiched between a magnetic pinned layer and a magnetic free layer; and
- a plurality of insulated-gate transistors disposed at intervals along the wiring in association with the plurality of tunneling magnetoresistive elements, each of the transistors having a part of the wiring as a gate electrode, and a channel region that is disposed close to the free layer of an associated one of the plurality of magnetoresistive elements,
- wherein the transistor is controlled such that when data is written to the magnetoresistive element, a channel current with a desired magnitude flows as a part of write current.

10. The magnetic random access memory according to claim 9, wherein the free layer and the pinned layer are set to have directions of spin, which coincide with a channel width direction of the channel region of the transistor.

11. The magnetic random access memory according to claim 10, further comprising:
- a word line formed to extend in the channel width direction of the channel region as a gate electrode of the transistor; and
- a bit line formed such that the tunneling magnetoresistive element is sandwiched between the bit line and the word line, the bit line being disposed in a direction perpendicular to the word line.

12. The magnetic random access memory according to claim 11, wherein at a time of data write, a magnetic field that is generated by a bit current flowing in the bit line and a magnetic field that is generated by the channel current are combined to produce a write magnetic field, and the write magnetic field controls the direction of spin of the free layer.

13. The magnetic random access memory according to claim 12, wherein at a time of data read-out, a read-out circuit is formed between the word line and the bit line via the tunneling magnetoresistive element.

14. The magnetic random access memory according to claim 9, further comprising:
- a word line formed to extend in a channel length direction of the channel region as a gate electrode of the transistor; and
- a bit line formed such that the tunneling magnetoresistive element is sandwiched between the bit line and the word line, the bit line being disposed in a direction perpendicular to the word line.

15. The magnetic random access memory according to claim 14, wherein at a time of data write and data erasure, a magnetic field that is generated by a bit current flowing in the bit line and a magnetic field that is generated by the channel current are combined to produce a write magnetic field, and the write magnetic field controls the direction of spin of the free layer.

16. The magnetic random access memory according to claim 15, wherein at a time of data read-out, a read-out circuit is formed between the word line and the bit line via the tunneling magnetoresistive element.

17. The magnetic random access memory according to claim 9, wherein the free layer and the pinned layer are set to have directions of spin, which coincide with a channel length direction of the channel region of the transistor.

18. The magnetic random access memory according to claim 17, further comprising:
- a word line formed to extend in the channel length direction of the channel region as a gate electrode of the transistor; and
- a bit line formed such that the tunneling magnetoresistive element is sandwiched between the bit line and the word line, the bit line being disposed in a direction perpendicular to the word line.

19. The magnetic random access memory according to claim 18, wherein at a time of data write and data erasure, a magnetic field that is generated by a bit current flowing in the bit line and a magnetic field that is generated by the channel current are combined to produce a write magnetic field, and the write magnetic field controls the direction of spin of the free layer.

20. The magnetic random access memory according to claim 18, wherein at a time of data read-out, a read-out circuit is formed between the word line and the bit line via the tunneling magnetoresistive element.

* * * * *